United States Patent [19]

Nishizuka et al.

[11] 4,298,273

[45] Nov. 3, 1981

[54] PROJECTION ALIGNER AND METHOD OF POSITIONING A WAFER

[75] Inventors: Hiroshi Nishizuka, Kodaira; Susumu Komoriya, Tachikawa; Koyo Morita, Higashimurayama; Takayoshi Osakaya, Kodaira, all of Japan

[73] Assignee: Hitachi, Ltd., Tokyo, Japan

[21] Appl. No.: 87,387

[22] Filed: Oct. 22, 1979

[30] Foreign Application Priority Data

Oct. 20, 1978 [JP] Japan ............................. 53-128367
Jun. 22, 1979 [JP] Japan ............................. 54-78213
Jul. 11, 1979 [JP] Japan ............................. 54-86926

[51] Int. Cl.$^3$ .......................................... G03B 27/52
[52] U.S. Cl. ...................................... 355/61; 355/77; 355/53
[58] Field of Search ............. 355/55, 78, 61, 45, 355/53, 54, 132, 77; 356/371, 125, 138

[56] References Cited

U.S. PATENT DOCUMENTS

| | | | |
|---|---|---|---|
| 3,260,153 | 7/1966 | Abbott, Jr. et al. | 355/45 X |
| 3,704,657 | 12/1972 | Sliwkowski et al. | 355/53 X |
| 4,084,903 | 4/1978 | Pircher | 355/53 |
| 4,093,378 | 6/1978 | Horr et al. | 355/53 |
| 4,140,392 | 2/1979 | Lacombat et al. | 355/53 X |
| 4,155,642 | 5/1979 | Lacombat | 355/53 |
| 4,179,110 | 12/1979 | Kosugi et al. | 355/78 X |
| 4,198,159 | 4/1980 | Cachon | 355/55 |
| 4,239,381 | 12/1980 | Lacombat et al. | 355/53 |

FOREIGN PATENT DOCUMENTS 2330030 5/1977 France .
1556028 11/1979 United Kingdom .

Primary Examiner—Richard A. Wintercorn
Attorney, Agent, or Firm—Craig and Antonelli

[57] ABSTRACT

A wafer projection aligner comprises an optical system for projecting a radiation pattern onto a surface of a semiconductor wafer and a wafer position setting apparatus for positioning the wafer at a position within a focal depth of the optical system for allowing printing of a fine pattern on the wafer. The wafer position setting apparatus includes paralleling means provided with three leveling pads defining a reference plane, air micrometers having a plurality of nozzles opened at least in the vicinity of respective ones of the leveling pads for measuring the distance between the wafer surface and the reference plane in a non-contacting manner, wafer leveling mechanism having a semispherical seat member for holding the wafer and adapted to be vertically movable between the reference plane and the focal plane, and control apparatus for controlling the wafer leveling mechanism so that a focal plane of the wafer is set on the basis of the measured convexity or concavity of the wafer surface as measured by air micrometer, when the parallelism of the wafer as measured by the air micrometer lies within a predetermined standard range.

29 Claims, 19 Drawing Figures

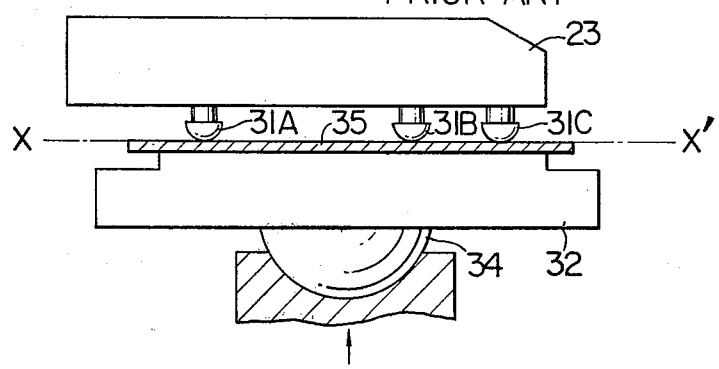
FIG.4 PRIOR ART
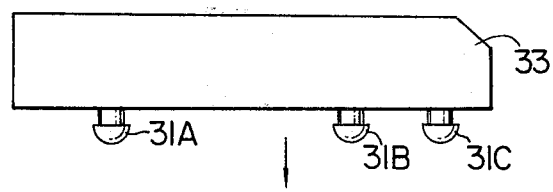
FIG.5 PRIOR ART
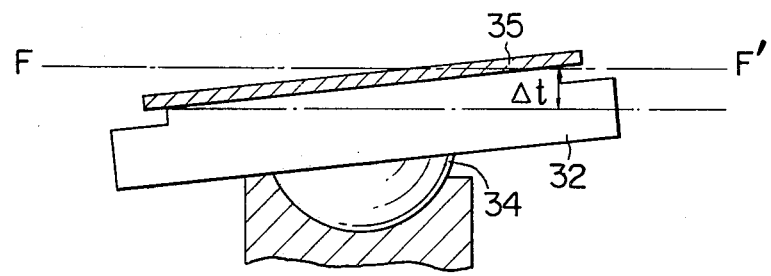

PROJECTION ALIGNER AND METHOD OF POSITIONING A WAFER

The present invention relates in general to projection alignment for fabrication of a semiconductor device. More particularly, the invention concerns an apparatus for setting a position of the semiconductor device to be exposed to light radiation in a projection aligner for mask alignment.

As the mask aligner used for fabrication of semiconductor devices, there has hitherto been known a projection exposure mask aligner, that is a projection aligner which operates to project a mask pattern onto a major surface of a semiconductor wafer for the exposure thereof after the positions of the mask and the semiconductor wafer are aligned with each other. For example, reference is to be made to Japanese Patent Publication No. 43024/1978 based on U.S. application Ser. No. 737,819, filed Nov. 1, 1976 now U.S. Pat. No. 4,093,378, issued June 6, 1978.

In the projection aligner, it is important to properly position the wafer surface to be exposed relative to the focussed image plane (hereinafter referred to as the focal plane) while maintaining the wafer surface strictly in parallel with the focal plane of the mask pattern in order to print the mask pattern on the wafer surface with high accuracy.

In a hitherto known wafer positioning apparatus of the projection aligner type, such as the microline model 100 fabricated by Perkin Elmer Inc., as seen in FIG. 1, a positioning reference ring 1 is fixedly secured with a lower surface thereof being precisely positioned relative to a focal plane 3. On the other hand, a semiconductor wafer 2 is held on a vacuum suction chuck 4 which is in turn supported in a chuck holder 5 by a plurality of springs $6a$, $6b$, ... and so forth arranged at the bottom of the chuck holder 5, as a result of which the wafer 2 is resiliently pressed against the annular lower surface of the reference ring 1 at a peripheral portion, whereby the wafer is properly positioned relative to the focal plane 3.

When the flatness of the top face of the wafer which is held under vacuum suction on the wafer chuck is measured after having been subjected to a polishing of a mirror quality, the flatness lies usually in a tolerance deviation range of $\pm 5$ $\mu$m. However, the flatness of the wafer which has undergone heat treatments such as diffusion, CVD process or the like treatment, is often deviated to the degree of $\pm 15$ $\mu$m due to contraction or expansion, warping or the like deformation ascribable to the heat treatments, even when measured under the same conditions. The focal depth of an optical system used usually for the exposure is generally in the range of $\pm 10$ $\mu$m relative to the focal plane 7, as indicated by curves $8a$ and $8b$ in FIG. 2. Accordingly, so far as the flatness of the wafer is in the tolerance range of $\pm 5\mu$, the whole surface of the wafer will fall within the range of the focal depth of the optical exposure system. However, in the case of the wafer which has undergone the heat treatments described above and exhibits the flatness deviation in the order of $\pm 15$ $\mu$m, a part of the concaved surface 9 of the wafer or a portion of the convexed surface 10 will be out of the range of the focal depth of the optical projection system, giving rise to a problem that an adequate resolving power cannot be attained.

As another wafer positioning device, there has been hitherto known a projection aligner having a structure such as illustrated in FIG. 3 and manufactured by Cobilt Inc. as the model CA3000. In the case of the prior art apparatus shown in FIG. 3, a semispherical-seat holder 13 is slidably supported in a cylindrical guide member 12 fixedly mounted on a mount table or platform 11. A vacuum wafer chuck 15 holding a semiconductor wafer 14 under suction is rotatably supported in the seat holder 13. Disposed below the seat holder member 13 is a pressure sensor 16 through which the seat holder member 13 can be moved in a vertical direction upwardly or downwardly by means of a screw type micrometer head 17. An output of the pressure sensor 16 is applied to a sequence controller 24. The micrometer head 17 is adapted to be moved upwardly or downwardly through rotation of a pulse motor 18 fixedly mounted on the table 11.

For the level positioning of the wafer 14 held by the suction chuck 15, the wafer is moved upwardly through the rotation of the pulse motor 18, until the surface of the wafer to be exposed has been brought into contact with leveling pads $19a$ to $19c$ provided on the reference surface of a paralleling member or reference level head 20. The wafer is positioned in parallel with the leveling pads, namely a focal plane of an exposure optical system (not shown) under the action of the contacting pads 19. In the course of the positioning process, when the pressure detected by the pressure sensor 16 has attained a predetermined value, the upward displacement of the wafer is stopped and the wafer chuck is then fixedly secured by vacuum to the semispherical seat holder member 13. The position of the wafer thus indexed is made use of as a reference zero position for lowering the wafer for a distance preset at a digital switch 23 to the position corresponding to the focal plane through the sequence controller 24, a motor driver 25 and the pulse motor 18.

However, the prior art apparatus of the above type suffers from shortcomings described below.

Usually, the upward movement of the wafer 14 is to be stopped when the load applied to a sensor element of the pressure sensor 16 which is commercially available as PITRAN (trade mark) manufactured by Stow Laboratories has been increased up to 400 grams (g). However, in reality, the wafer is caused to stop at an indefinite load level in the range of 300 to 500 g in dependence on the detection sensitivity of the pressure sensor as used. Besides, flexure displacement of the paralleling member 20 in addition to the deviation in the displacement of the pressure sensor which amounts to 15 $\mu$m or more or less in sum will occur to bring about deviation or drift in the zero point with reference to which the wafer is to be moved downwardly for the preset distance. Such being the circumstances, it is difficult to position the wafer at the focal plane after the wafer has been positioned in parallel with the focal plane because of possible deviation or positional error of the reference zero position.

Further, as the prior art mask aligning apparatus of the non-contact type, a projection aligner has been proposed in which a mask pattern is projected on a wafer surface, whereby positional alignment of the mask pattern with the wafer and then the exposure of the latter are effected. In the case of the projection aligner of this variety, the positioning of the wafer within a region corresponding to the focal depth of the optical projecting system as used is of importance. In this conjunction, a wafer positioning or paralleling system such as shown in FIG. 4 has been proposed. The wafer positioning of the wafer 35 supported on a chuck 32 is effected also by pressing the wafer 35 upwardly against leveling pads 31A, 31B and 31C provided on the lower surface of a positioning member 23 in a well known three-point array and defining a reference plane X—X' and is then moved downwardly to the position corresponding to the focal point of the optical projection system at which the exposure of the wafer to a patterned radiation is performed. Due to such arrangement that the positioning of the wafer in parallel to the reference plane is effected by pressing the wafer mounted on a semispherical seat 34 through a wafer chuck 32 to the reference plane through mechanical positioning or indexing means, there may arise the case where the wafer is possibly positioned with an inclination of $\Delta t = \pm 10$ μm as shown in FIG. 5 because of frictional force of seat 34 subjecting the wafer to the exposure in the inclined state, undesirable degradation in the resolution power occurs particularly at a peripheral portion of the wafer. The tendency of the wafer to be inclined as described above may be explained by the fact that photoresist applied on the surface of the wafer to be exposed and foreign matter may be unevenly deposited on the contacting areas of the leveling pads as the positioning of the wafer is repeated, to thereby give rise to the inclination of about $+10\mu$ for a conventional size of wafer. Of course, a curvature or warping in the wafer will cause a portion of the wafer to be located out of the focal depth of the projecting optical system even after the paralleling procedure described above, whereby the surface portion of the wafer lying out of the focal depth cannot be patterned with a desired resolution power.

Accordingly, a primary object of the present invention is to provide a projection aligner which is immune to the disadvantages of the prior art projection aligners described above and which is capable of always positioning the whole surface of a semiconductor wafer to be exposed within a region covered by a focal depth of a projecting optical system to minimize the uneven distance of the whole wafer surface relative to the focal plane of the optical system to thereby allow the wafer to be exposed to image a fine radiation pattern.

Another object of the invention is to provide a projection aligner which is capable of accurately measuring the distance of the wafer surface relative to the focal plane and positioning the semiconductor wafer of a relatively large diameter in a focal plane in parallel thereto and setting a major surface of the wafer along the focal plane with enhanced accuracy.

Another object of the invention is to provide a projection aligner capable of correcting inclination of the wafer surface relative to the reference parallel plane with repeated levelling.

Still another object of the invention is to provide a wafer positioning apparatus for a projection aligner which is capable of positioning a surface of a semiconductor wafer to be exposed positively in parallel with a reference plane and subsequently setting the wafer in the focal plane of the projection optical system on the basis of the flatness of the wafer surface measured in positions thereon to thereby improve resolution power at a peripheral edge portion of the wafer and enhance eventually fabrication yield of semiconductor devices in the semiconductor wafer.

In view of the above and other objects which will become more apparent as description proceeds, it is proposed according to an aspect of the invention that a wafer is pressed against a reference plane at a peripheral portion thereof to thereby position the wafer at a desired paralleled position and subsequently it is determined whether the wafer surface is of a concave profile or a convex profile through measurements with the aid of contactless sensors such as air micrometers at different points on the wafer surface. Subsequently, it is arithmetically determined on the basis of the measurement results where the focal plane of the optical projecting system should be positioned relative to the height of the wafer in order to assure that the whole surface of the wafer to be exposed is positioned effectively in a region covered by the focal depth (depth of focal point) of the optical projecting system. Further, deviation of a theoretical focal plane for the semiconductor wafer from the reference plane, if any, is arithmetically determined, whereby the wafer carried on a chuck is displaced to make the theoretical focal plane to coincide with the reference plane. Thereafter, the wafer is subjected to the exposure of a desired radiation pattern. By virtue of the positioning of the reference plane in coincidence with the focal plane of the optical projecting system, the focal depth in the range of 20 μm becomes available, so that the whole surface of the wafer even having a convexity of $+15$ μm or concavity of $-15$ μm may be located within the focal depth of the optical system. Thus, projection and printing of a desired pattern can be accomplished over the whole surface of the wafer in a satisfactory manner.

According to another aspect of the invention, the distance between the wafer and the reference plane is actually measured during the lowering of the wafer toward the focal plane after having been paralleled thereto, and when the measured distance has attained a predetermined value corresponding to the focal plane, the downward displacement of the wafer is stopped.

In a preferred embodiment of the projection aligner according to the invention, the parallel indexing of the wafer surface for the positioning thereof at the focal plane is effected by causing the wafer surface to contact a plurality of leveling pads constituting a reference plane. Subsequently, at a lowered position of the wafer relative to the reference position, the parallelism of the wafer is measured with the aid of a plurality of air micrometers provided at different locations of the reference plane. The parallel indexing operation and the measurement of the parallelism of the wafer relative to the reference plane are carried out repeatedly. When the parallelism of the wafer has attained a predetermined reference value, the wafer is then set at the focal plane of the optical projecting system in the attained state. The wafer is thereafter subjected to exposure. An improved resolution can be attained even at the peripheral portion of the wafer. The projection aligner described just above is particularly suited for the exposure of a wafer having a relatively large diameter e.g., 100 millimeters.

The above and other objects, features and advantages of the invention will become more apparent from the following description of preferred embodiments of the invention taken in conjunction with the accompanying drawings, in which:

FIG. 4 is a front view showing a leveling device employed in a hitherto known projection aligner;

FIG. 5 is a similar view to FIG. 4 to show another prior art leveling device;

FIGS. 17, 18 and 19 show main portions of a wafer position setting apparatus according to the invention, wherein FIG. 17 is a plan view, and FIGS. 18 and 19 are front views.

Now, the invention will be described in detail in conjunction with exemplary embodiments thereof by referring to FIGS. 6 to 19.

Figure 6:
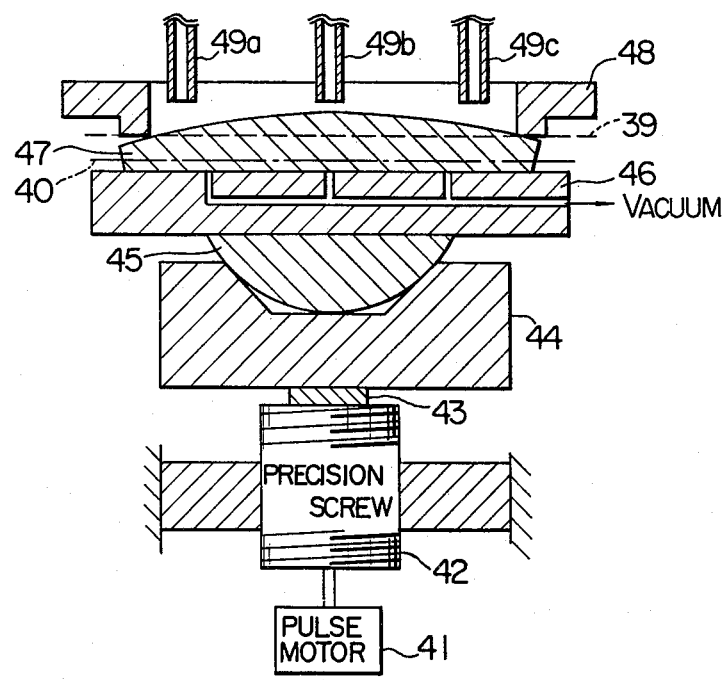
FIG. 6 is a sectional view illustrating an apparatus for positioning a surface of a semiconductor wafer in a projection aligner according to an embodiment of the present invention.

FIG. 6 shows a structure of a wafer position setting apparatus having non-contacting sensor elements disposed over a surface of the wafer with a spacing. For simplification an associated electrical circuit is omitted. In the Figure, reference numeral 41 denotes a pulse motor having an output shaft coupled to a precision screw 42 through an appropriate coupling. A pressure sensitive element 43 such as PITRAN mentioned above is secured to the precision feed screw 42 and supports slidably a ball holder or wafer chuck holder 44 at the top end face thereof. In this connection, it should be noted that friction between the contacting surfaces of the pressure sensitive element 43 and the precision feed screw 42 is reduced to a possible minimum. The rotation of the screw 42 serves only to move the ball holder 44 upwardly or downwardly because of stoppers (not shown) provided on the element 43 and holder 44. Reference numeral 45 denotes a semispheric seat for the parallel indexing or positioning purpose, which seat is rollingly received in the wafer chuck holder 44.

Reference numeral 46 denotes a vaccum type wafer chuck which is adapted to hold a wafer 47 stationarily thereon under vacuum suction. Numeral 48 denotes a paralleling reference ring. Nozzles of air micrometers 49a, 49b and 49c are disposed on the reference plane over the wafer 47 in the vicinity of the inner periphery of the reference ring 48 and around the center of the wafer 47, respectively. The micrometer 49 may be a type which comprises an air nozzle, an air-to-electrical converter and an A-D converter, such as fabricated by Tokyo Precision Co. with a repetition accuracy of ±1 μm. In the positioning operation, the pulse motor 42 is rotated to move the feed screw 42 and hence, the wafer 47 upwardly. When a portion of of the wafer 47 is brought in contact with the positioning reference ring 48, the wafer 47 is positioned in parallel to the reference plane 39 defined by the lower inner periphery of the reference ring 48 under the rolling action of the semispheric seat 45. When the precision screw 42 is further moved upwardly, the pressure sensitive element 43 is subjected to a slight deformation of a predetermined magnitude (e.g., about 20 μm) whereby a preset pressure set to protect the wafer is detected to stop the operation of the pulse motor 41. Consequently, the wafer 47 is pressed against the reference ring 48 under the preset pressure.

Subsequently, measurement is made as to possible displacement of the wafer surface from the lower peripheral edge 39 of the reference ring 48 which defines the reference plane by means of the air micrometers 49a, 49b and 49c. In other words, the vertical distance between the wafer surface and the reference plane at the locations corresponding to the air micrometers 49a, 49b and 49c are measured.

Next, an average value of the measured displacements is determined. By positioning the focal plane of the optical projection system at the average distance, the whole surface of the wafer can be exposed in a satisfactory manner. Although the average distance can be used for determining the position of the focal plane, it is conceivable that the position of the most effective focal plane in the sense described above will be determined through various arithmetic operations on the basis of the displacements as measured by the air micrometers in consideration of the locations thereof as well as the warping of the wafer surface.

The focal plane 40 of the optical projecting system is set below the reference plane 39 in parallel to the latter with a distance of 100 μm therefrom. It is presumed that the average value of the displacements described above is allotted with a positive sign (+) for the convex wafer surface, while a negative sign (−) is assigned for the concave wafer surface. The pulse motor 41 is rotated in the number of rotations corresponding to a sum of the average value of the measured displacements and the distance of 100 μm to thereby move downwardly the wafer 47 for a distance corresponding to the sum.

In this manner, the focal plane of the optical system can be set at an average height of the wafer 47 regardless of whether the wafer surface has a concave or a convex profile, whereby the whole surface of the wafer 47 can be positioned within the range of the focal depth of the optical system. Upon exposure of the wafer surface, nozzles of the micrometers 49a, 49b and 49c may provide obstacles. Accordingly, it is preferred that the wafer 47 as well as the holding system therefor be horizontally rotatably supported by means of air bearing or the like to thereby allow them to be angularly displaced with the height and the parallelism of the wafer relative to the focal plane being maintained constant, so that the exposure can be carried out at the position where the micrometers 49a, 49b and 49c are not located above the wafer surface to be exposed. That is, the chuck holder 44, the seat 45 and the wafer chuck 46 which carry the positioned wafer are shiftable out of the air-nozzle assembly location and the installed position of the feed screw into the optical system.

It will be appreciated that the whole surface of a wafer having a significant convexity or concavity can be placed at the position covered by the focal depth of the optical system for the exposure. When deformation of the pressure sensitive element 43 is to be taken into consideration, this can be easily accomplished by adding the value of deformation, e.g., 20 μm to the arithmetically determined control quantity for the pulse motor 41 described above. The measurement of convexity or concavity of the wafer is performed in its pressure contact with the reference ring in the above embodiment. In order to compensate for the deformation of the reference ring, the measurement may be performed in a condition that no pressure is applied to the ring by lowering the wafer chuck by about 50 μm before doing it. In this case, no correction is necessary due to the deformation of the sensitive element 43. With the arrangement of the wafer positioning apparatus described above, the whole surface of the wafer which has a flatness deviation in the range of ±5 μm can be positioned satisfactorily within a range of focal depth of ±10 μm, whereby a fine pattern can be printed with a high resolving power on the order of 2 to 3 μm over the whole surface of a wafer of a relatively large diameter. Thus, a semiconductor device in the form of a large scale integration chip or LSI chip can be fabricated with an enhanced yield. In the above embodiments, it is assumed that deformations of the reference ring and the pressure sensitive element have constantly predetermined values.

Figure 1:
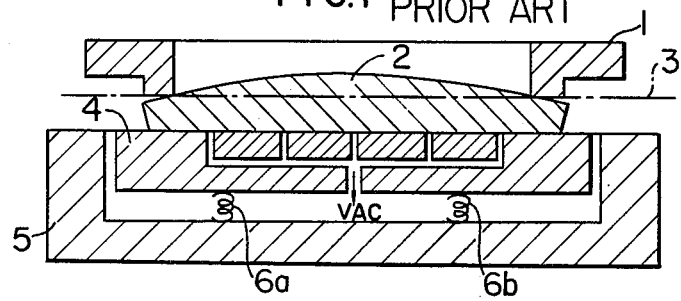
FIG. 1 is a sectional view to illustrate a prior art method of positioning a semiconductor wafer for fabrication of a semiconductor device.
Figure 2:
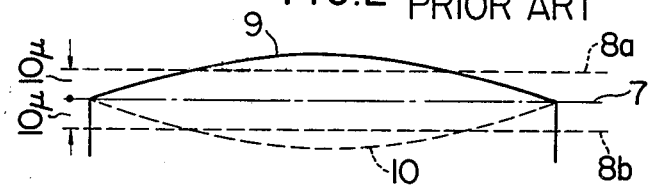
FIG. 2 is to illustrate a case in which a part of a wafer surface lies out of a range of a focal depth of an optical projection system in a prior art projection aligner.
Figure 3:
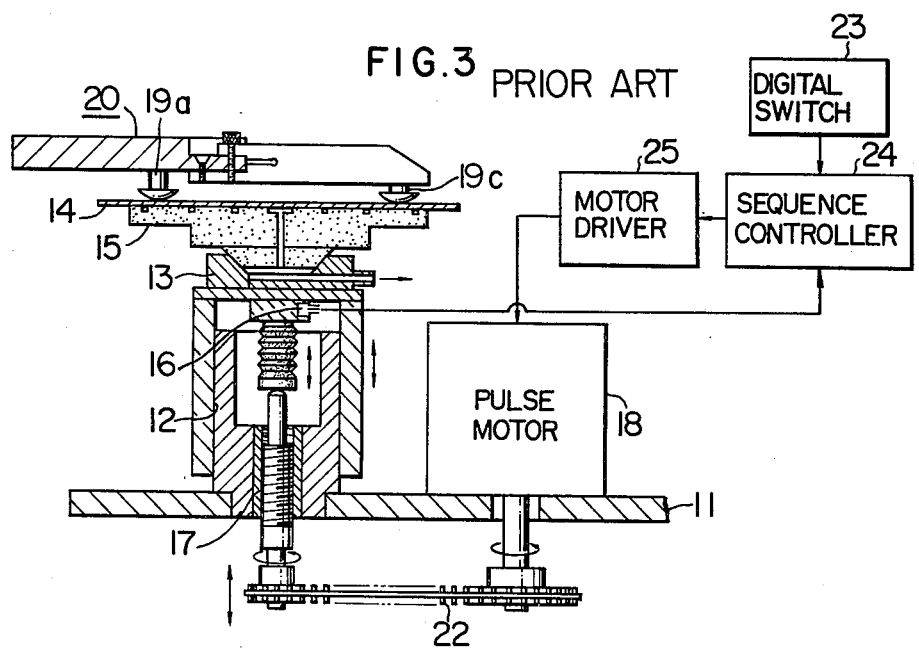
FIG. 3 is a front view for illustrating a method of setting a wafer position in a hitherto known projection aligner.
Figure 7:
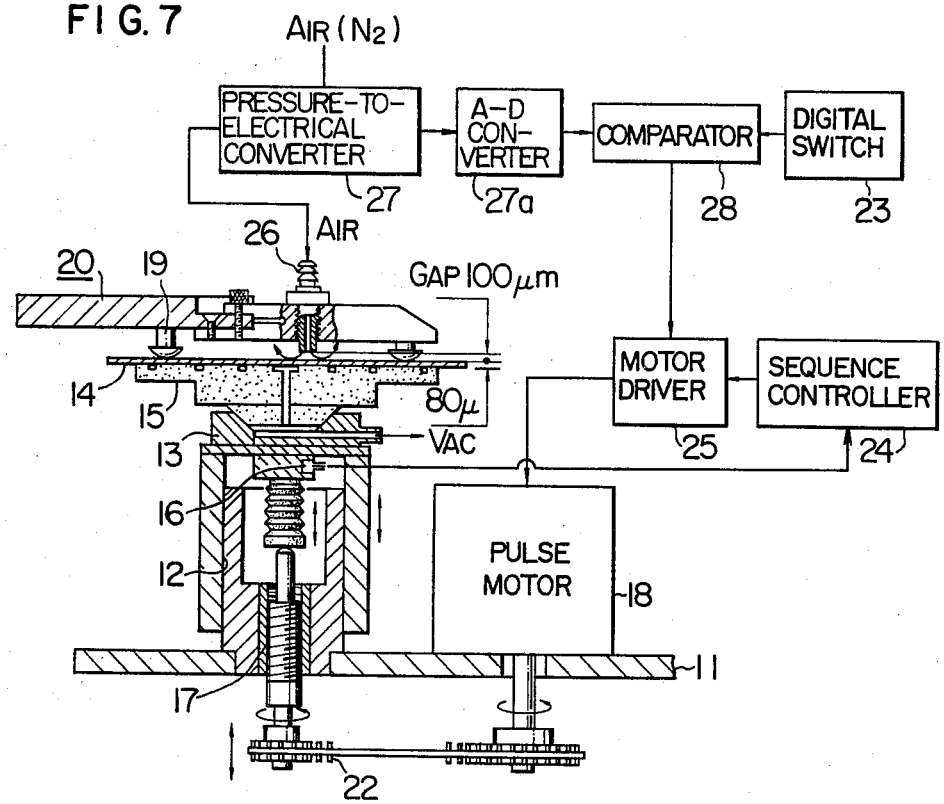
FIG. 7 is a front view to illustrate a method of setting the position of a wafer according to the invention.

The following embodiments are the case different from the above assumption. FIG. 7 shows in a front view a wafer position setting or indexing apparatus for the projection aligner according to another embodiment of the invention. In FIG. 7, the parts which are the same or similar as those shown in FIG. 3 are denoted by the same reference numerals. The wafer holding mechanism may employ that of FIG. 3 such as CA3000 mentioned above. The wafer positioning apparatus shown in FIG. 7 essentially differs from the apparatus shown in FIG. 3 in that a nozzle 26 of an air micrometer is provided at a middle portion of the paralleling member or reference level head 20, wherein pressure derived from the nozzle 26 is applied to a pressure-electric signal converter 27 for producing an electric signal representing a distance between the reference plane established by the leveling pads and the wafer surface, which signal is converted by a A-D converter 27a into a digital signal and then compared with a value set at digital switches 23 by a comparator 28 to control the pulse motor drive circuit 25. In the digital switches 23, the number of the leveling operation and the focal plane, etc. are set.

Figure 8:
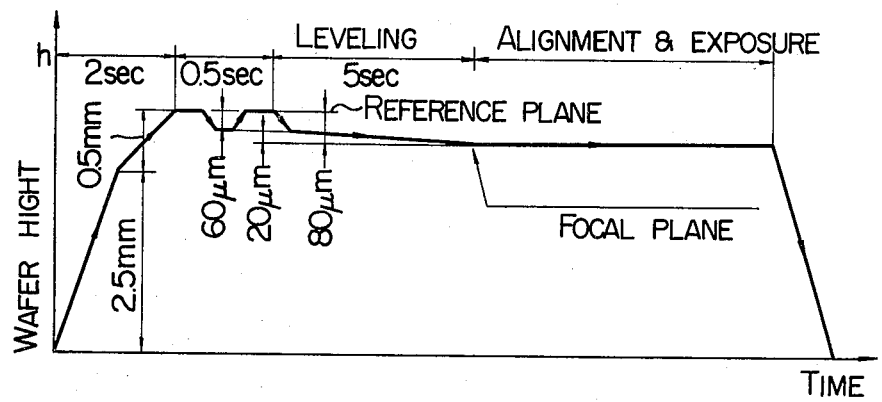
FIG. 8 is a time chart to illustrate a wafer position setting process in carrying out the method according to the invention.

Operation of the wafer positioning apparatus shown in FIG. 7 will be described by referring to a time chart shown in FIG. 8. The wafer chuck 15 holding thereon a wafer 14 is caused to move upwardly at a high speed to a position short of the leveling pads 19 by a distance of 0.5 mm and then moved upwardly at a reduced speed. When the upper surface of the wafer 14 is brought into contact with three leveling pads 19 of the paralleling member 20 which are previously so adjusted that a plane containing the contacting ends of the leveling pads extends in parallel with an image plane of a projected mask pattern, pressure applied to the pressure-sensitive element 16 will be increased to a predetermined level, which is then detected and delivered to the sequence controller 24 in the form of an electrical signal to stop the upward movement of the wafer in accordance with the setting of switch 23. In the case of the positioning operation illustrated in FIG. 8, the contacting of the wafer to the leveling pads is repeated twice for attaining a perfectly leveled disposition of the wafer. Such leveling operation may be repeated for a given number of times under the control of the digital switch 23 and the sequence controller 24. The wafer thus indexed in the leveled position is now moved downwardly. During the downward displacement of the wafer 14, the distance between the surface of the wafer 14 and the reference plane is measured by the nozzle 26 of the air micrometer in the manner described above. The pressure derived from the nozzle 26 is applied to the converter 27 to be converted into a corresponding electric signal which is then applied to an input of the comparator 28 having the other input connected to the digital switch 23. A predetermined distance between the wafer surface and the reference plane is preset at the digital switch 23 (in the case of the operation illustrated in FIG. 8, the preset distance is selected equal to 80 μm). When the wafer is lowered to the position corresponding to the focal plane of the optical projection system, the signal value from the converter 27 coincides with the preset value stored in the digital switch 23, whereby the operation of the pulse motor 18 is stopped by the output signal from the comparator through the driver circuit. In this way, the wafer is positioned at the focal plane accurately. Subsequently, after the mask position is aligned with the wafer position, the wafer is exposed to a radiation pattern. The sequence controller 24 shown in FIG. 7 serves to control the upward and downward movements of the wafer described above through the motor driver circuit 25 and the pulse motor 18.

Figure 9:
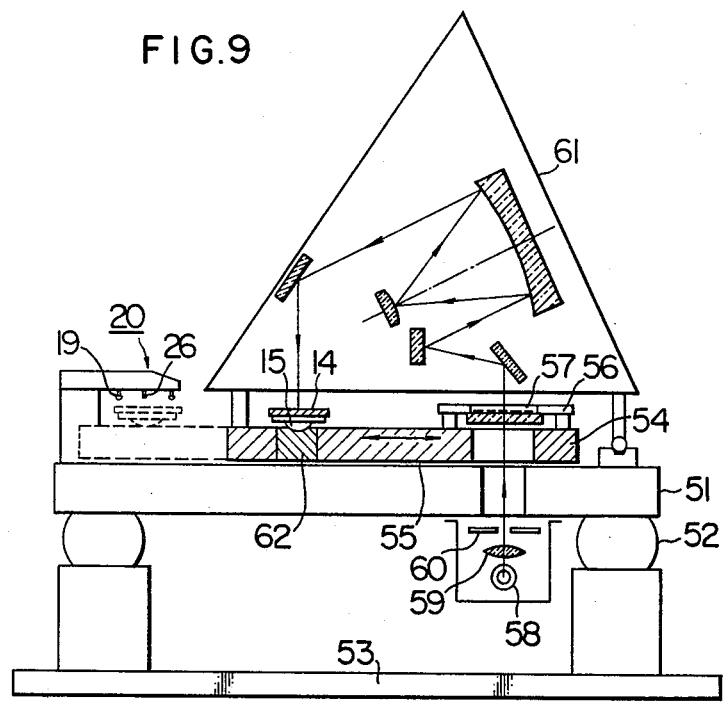
FIG. 9 is a front view to show schematically a general arrangement of a projection aligner which incorporates the wafer position setting mechanism shown in FIG. 7.

A structural relation between the wafer positioning apparatus described above and the other portion of the scan projection aligner according to an embodiment of the invention is illustrated in FIG. 9.

Referring to FIG. 9, numeral 51 denotes a ruler plate made of granite which is horizontally supported on a base 53 through legs each being provided with a cushion member 52. A scan table 54 is supported on the ruler plate 51 slidably in a horizontal direction through an air bearing 55. A mask 57 is held by a mask holder 56 which is mounted on the scan table 54. A light source (mercury arc lamp) 58 is disposed below the ruler plate 51. Light rays emitted from the lamp 58 is directed toward the upper surface of the wafer 14 through a lens 59, a slit 60, the mask 57 and an optical system including a plurality of planar and curved reflecting mirrors contained in an optical head 61.

As described above, the wafer 14 is mounted on the scan table 54 through a wafer holder 62. The wafer holder includes the wafer chuck 15 carrying the wafer, the semispheric seat the guide member 12 and the seat holder member 13. In this connection, it is to be noted that the wafer 14 is actually mounted on the holding system on the table 11 shown in FIG. 7 so as to be vertically movable. The table 11 corresponds to the ruler plate 51. The wafer holder 62 in turn is moved by the air bearing 55 in a horizontal direction on the scan table 54 shown in FIG. 9 in position from the member 20 to the optical system so that the pattern formed in the mask 57 may be projected onto the wafer 14 through the optical system described above. With a view to eliminating the aberration of the optical system, the light beam produced from the source lamp 58 through the condenser lens 59 is shaped by a slit 60 in an arcuate cross-section, whereby the mask 57 and the wafer 14 are scanned by the light beam as the scan table 54 is moved in the horizontal direction as indicated by an attached arrow.

It will be recalled that before the scanning exposure the leveling and paralleling of the wafer relative to the focal plane is carried out with the scan table 54 being positioned at the location indicated by phantom lines in FIG. 9 and thereafter the scan table is moved to the position indicated by solid lines in FIG. 9 where the scanning exposure is conducted after the wafer 14 held on the holder 62 has been aligned in position relative to the mask.

With the arrangement of the wafer position indexing or setting apparatus according to the embodiment described in the foregoing, the wafer can be positioned accurately at the focal plane of the optical projection system by measuring the distance between the wafer and the reference plane with reference to which the wafer has been leveled and by stopping the indexing movement of the wafer when the wafer surface has attained the position corresponding to the focal plane. In other words, since distance between the wafer and the reference plane is measured by the contactless type micrometers during the operation of downward movement of the wafer after the wafer has been leveled relative to the reference plane, the measurement and hence the positioning of the wafer at the focal plane are essentially insusceptible to adverse influences due to possible unevenness in the displacement or deformation of the pressure sensitive element and the leveling member. Further by providing the nozzle of the air micrometer at a position corresponding to a center position of the wafer, a middle portion of the wafer surface can be set at the focal plane. This is very advantageous over the prior art positioning method according to which the peripheral edge portion of the wafer is indexed to the focal plane as described hereinbefore in view of the fact that the semiconductor device of a high quality is more likely to be implemented at the center portion of the semiconductor wafer rather than the peripheral portion, particularly in the case of the semiconductor wafer having appreciable convexity or concavity.

Figure 11:
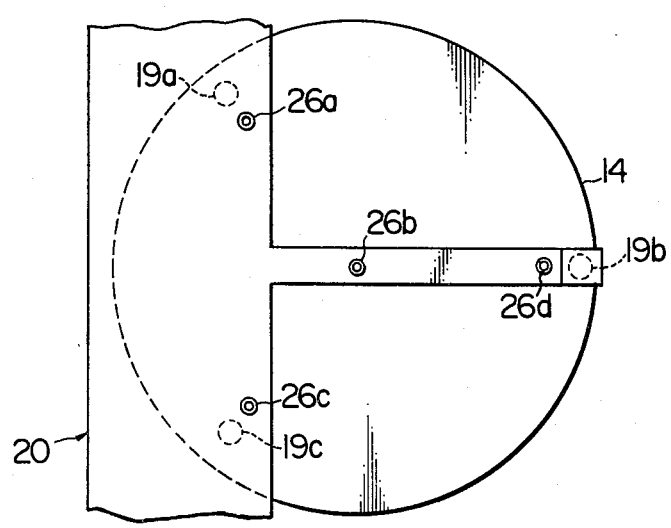
FIGS. 10 and 11 show another embodiment of the invention is a front view and a plan view, respectively.
Figure 10:
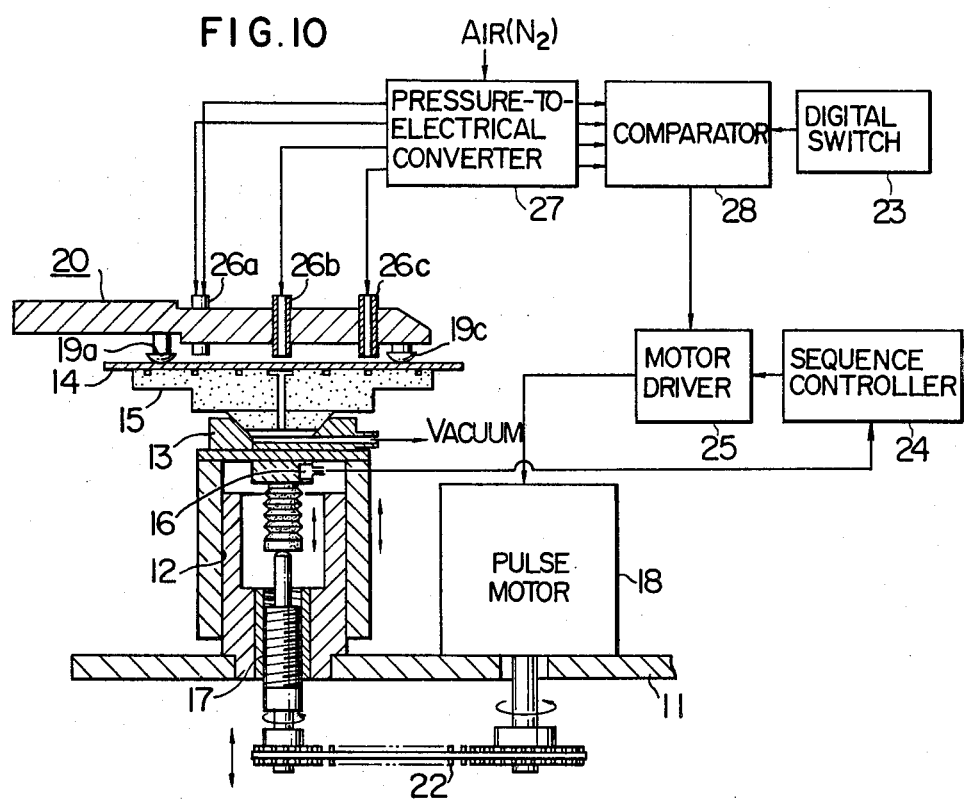

FIGS. 10 and 11 show a modification in which a plurality of air nozzles of air micrometers are disposed over the wafer as indicated at 26a, 26b, 26c and 26d and an average value is derived from the measurements by the individual nozzles to represent the distance between the reference plane and the focal plane, whereby the whole surface of the wafer can be placed within the focal depth of the optical projection system in a more satisfactory manner, to involve a further enhanced yield of the products. In these figures, reference symbols 19a, 19b and 19c denote leveling pads.

Although description has been made on the assumption that the air micrometers are used as the means for measuring the distance between the reference plane and the wafer, it will be appreciated that other suitable measuring means such as electric micrometers of an electrostatic capacitance type may be equally employed. However, it is preferred to use the contactless sensor means such as the air micrometer because there arises no danger of the wafer surface being injured.

Figure 12:
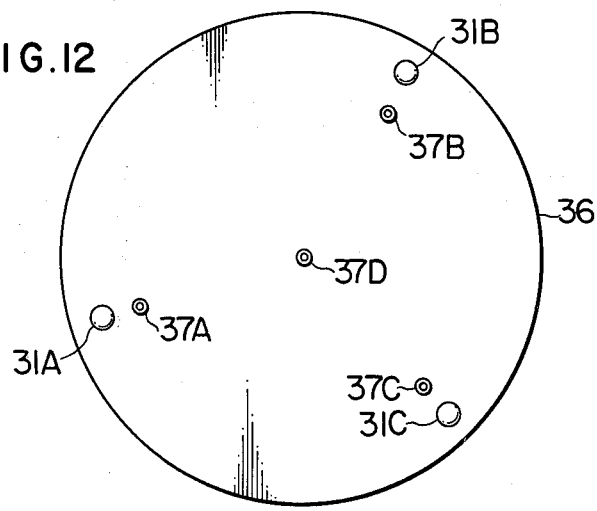
FIGS. 12 and 13 show arrangements to illustrate the principle of the wafer position setting method according to the invention in a plan view and a front view, respectively.
Figure 13:
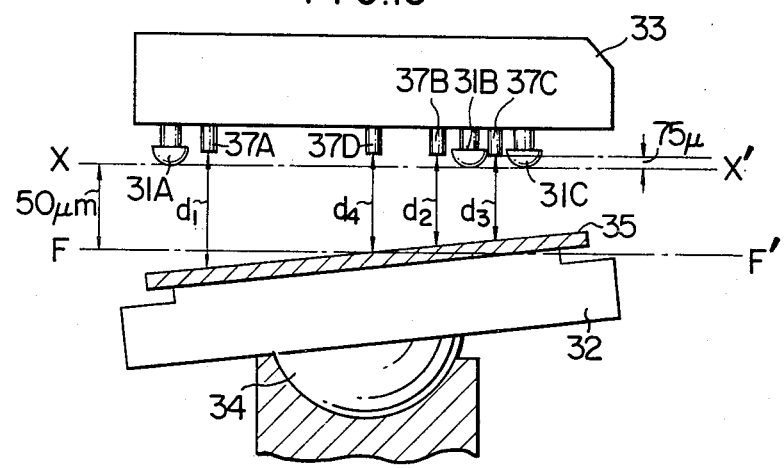

Next, description will be made of another exemplary embodiment of the invention. FIGS. 12 and 13 are to illustrate the principle of the wafer position setting or indexing method according to another embodiment of the invention. In these figures, the same or like parts as those shown in FIGS. 4 and 5 are denoted by the same reference symbols. In FIG. 12, three circles 31A, 31B and 31C represent locations of the leveling pads and four doubled circles 37A, 37B, 37C and 37D represents the locations of the nozzles of air micrometers, while a large circle 36 represents a semiconductor wafer. Three of the nozzles (37A, 37B, 37C) have respective orifices opened in the vicinity of the associated leveling pads, while the other one 37D is opened at a substantially center portion of the wafer.

The wafer 35 is held on the vacuum wafer chuck 32 under suction and moved upwardly to be contacted by the leveling pads. Subsequently, the leveled wafer is moved downwardly about 50 $\mu$m for the leveling pads and subjected to air jets from the nozzles 37A, 37B and 37C of the micrometers mounted on the reference level head 33. Concurrently, the back pressure of the individual nozzles are measured to arithmetically determine the distances d1, d2, d3, ds between the individual nozzles and the wafer surface thereby to determine the parallelism of the wafer surface (i.e. inclination of the wafer). When the inclination is out of the range of 2 $\mu$m, the leveling operation is repeated. Preferably, the standard range of the inclination (e.g. ±2 $\mu$m) may be previously set and the leveling operations may be repeated until the inclination of the leveled wafer surface falls within the standard range. When the parallelism or inclination of the wafer is within the standard, it is decided that the wafer is positioned in parallel to the focal plane F-F' and subjected to the exposure of a mask pattern. When the number of the repeated leveling operations exceeds a predetermined value (e.g. 5 times), an alarm is produced for signalling the presence of undesirable conditions such as deposition of dust of the like foreign material on the leveling pads or wafer surface.

By virtue of the distance measurement through the four micrometers 37A to 37D, bent or warping as well as concavity and convexity of the wafer surface can be identified. More particularly, in succession to or simultaneously with the leveling or paralleling of the wafer through the three nozzles 37A, 37B and 37C mounted on the reference level head 33, the concavity or convexity of the wafer at the center portion thereof is measured by using the centrally disposed nozzle 37D. Subsequently, on the basis of the measured results, the height of the focal plane relative to the wafer in the thickness direction thereof at which the whole surface of the wafer can be effectively covered by the focal depth of the optical projection system is arithmetically determined. For example, the average of measurements from the four nozzles is taken using microcomputers. Thereafter, the wafer is displaced as being carried on the chuck to the position where the theoretical focal plane for the satisfactory exposure of the wafer coincides with the focal plane F-F' of the optical system, and the wafer is subjected to the exposure of a mask pattern.

With arrangement of the wafer position setting apparatus shown in FIGS. 12 and 13, even the wafer having a convexity of +15 $\mu$m or concavity of -15 $\mu$m can be satisfactorily printed with the desired mask pattern with a high resolving power, provided that the optical projection system has a focal depth in the range of 20 μm.

Figure 14:
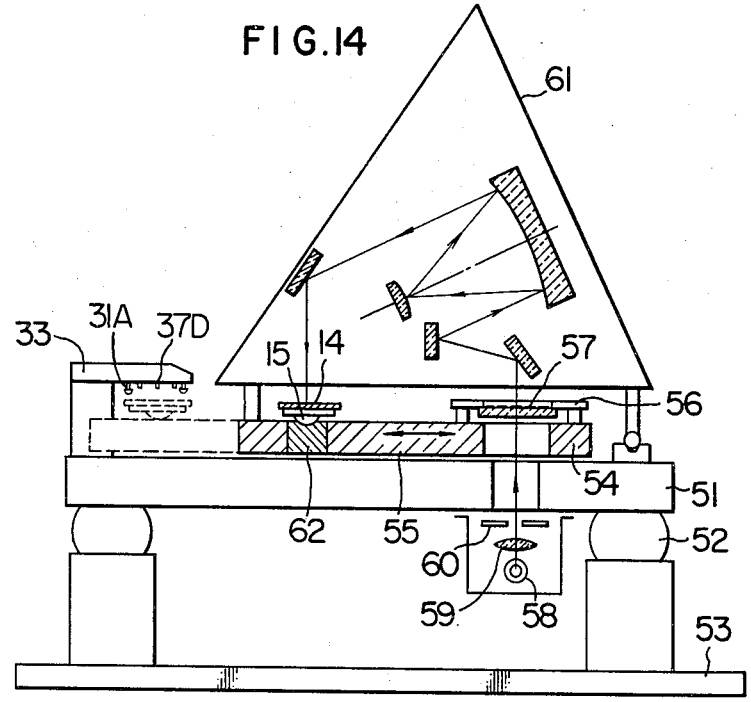
FIG. 14 shows a general arrangement of a projection aligner according to the present invention with portions shown in section.
Figure 17:
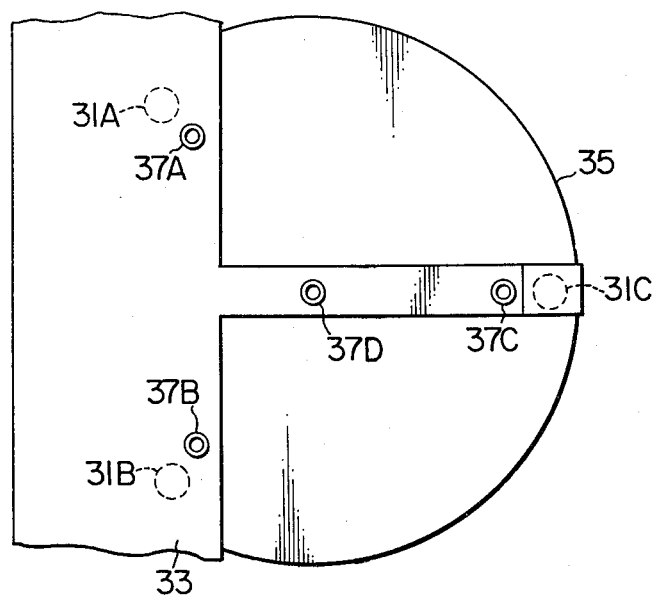
Figure 18:
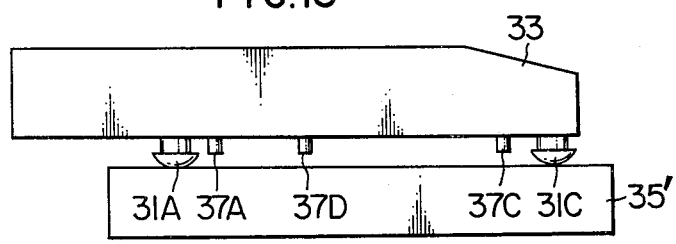
Figure 19:
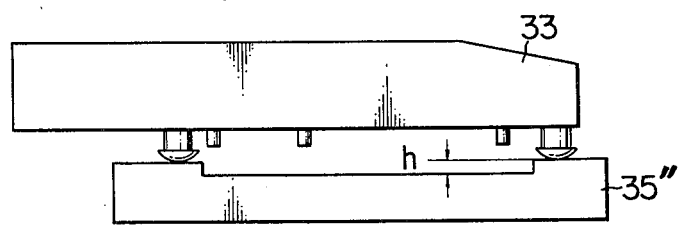

FIG. 14 shows schematically a general arrangement of a projection aligner incorporating a wafer position indexing apparatus such as shown in FIGS. 12 and 13. Since the arrangement of the optical exposure system is substantially same as that of the projection aligner described hereinbefore in conjunction with FIG. 9, further description will be unnecessary. There is disposed at a side of a ruling plate 51 a leveling or paralleling member 33 which is provided at the lower surface thereof with three leveling pads 31A, 31B and 31C as well as four nozzles 37A, 37B, 37C and 37D of air micrometers which have orifices opened over the top surface of the wafer positioned below the leveling member 33, as is illustrated in FIGS. 17, 18 and 19, of which FIG. 18 shows a zero adjusting plate 35′, while FIG. 19 shows a magnification factor adjusting plate 35″. The zero adjusting plate is finished in the flatness tolerance of ±1μ and serves to define the reference plane when pressed against the leveling pads in place of the wafer, thereby to allow a zero adjusting knobs for the air micrometers to be adjusted so that the readings in the air micrometers become zero. On the other hand, the magnification adjusting plate 35″ has a cavity offset from the top surface by an amount h=80 μm and exhibits a parallelism with a tolerance in the range of ±1 μm. The magnification adjusting plate 35″ is used to adjust the magnification of the air micrometers so that the readings in the air micrometers become 80 μm when pressed against the leveling pads. At the position of the scanning plate 54 indicated by broken lines in FIG. 14, the leveling or paralleling operation as well as the positioning of the wager at the focal plane of the optical system on the basis of the measurement by the air micrometers are carried out. Thereafter, the scanning plate is moved in the horizontal direction as indicated by an attached arrow along the ruling plate 51 to the position indicated by a solid line where the wafer is subjected to the exposure of a mask pattern after the positional alignment with the mask, as described hereinbefore.

Figure 15:
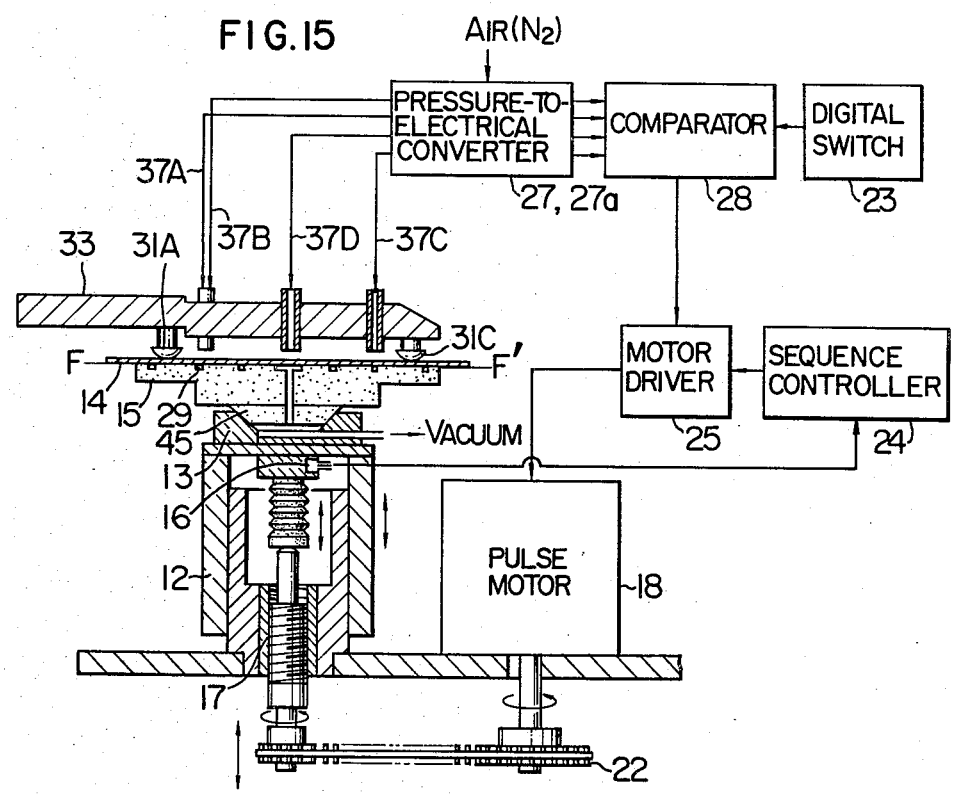
FIG. 15 shows in a sectional view a main portion of a wafer position setting apparatus according to the invention together with an electrical system shown in a block diagram.

FIG. 15 shows a wafer position setting apparatus for the projection aligner according to another embodiment of the invention which is substantially identical with the apparatus shown in FIG. 10 except for the structure of the reference level head 33. Referring to FIG. 15, there is provided a pulse motor 18 which is operatively coupled to a micrometer head 17 contained in a cylindrical guide 12 through a transmission mechanism such as a pulley-belt system. Through the rotation of the micrometer head 17, pressure applied to a pressure sensitive element 16 undergoes variation. Numeral 45 denotes a semispherical seat which is rollingly (universally rotatably) received in a socket member 13 and serves to support a wafer chuck 15 freely at any angular position in a certain range. A plurality of grooves 19 are formed in the top surface of the wafer chuck 29 for holding a semiconductor wafer 14 rested thereon under vacuum suction. The leveling or paralleling member 33 is provided with leveling pads 31A, 31B and 31C as well as nozzles 37A, 37B, 37C and 37D in an array such as shown in FIG. 17. Pressure signals from the nozzles of the air micrometers are supplied to an air pressure-to-electrical signal converter 27 the output of which is connected to a digital comparator 27. Numerals 23 and 24 respectively, denote a digital switch and a sequence controller for controlling operation of the pulse motor 18 by way of a motor drive circuit 25.

In operation, the pulse motor 32 is driven to move the wafer upwardly through the micrometer head 17. Upon contacting of the wafer 14 with the leveling pads, the paralleling or leveling of the wafer is accomplished under the action of the semispherical seat. In the embodiment, a low vacuum of 0.5 inch Hg acts on the semispherical seat, so that it may fix the water without causing a friction preventing the rotation of the seat. Subsequently, a slight displacement of the micrometer head 17 in the upward direction will bring about a deformation in the pressure sensitive element 16, whereby a preset pressure is detected. At this point in time, a low vacuum state having prevailed in the spherical seat of the airbearing type is changed over to a high vacuum state thereby to fix the semispherical seat in place. Thereafter, the pulse motor 18 is rotated in the reverse direction to lower the wafer about 50 μm, for example. Then, the wafer surface is subjected to the jet streams of an inactive gas such as nitrogen gas from the three nozzles of the air micrometers to measure the distance between the wafer surface and the reference plane X-X′ (FIG. 13) at the three points on the wafer surface corresponding to the locations of the jet nozzles. On the basis of the measurements, possible inclination of the wafer is determined by the comparator 28 in the manner described hereinbefore. If the inclination is greater than 2 μm, for example, the pulse motor is again rotated in the forward direction to bring the wafer in contact with the leveling pads thereby to effect the leveling operation for the wafer. When the inclination of the wafer is within a standard range of +2 μm, for example, it is determined that the leveling of the wafer has been accomplished. Then, the measurement of the convexity or concavity of the wafer surface by additionally using the center nozzle 37D. Namely, measurement of the distance between the wafer surface and the reference plane is effected with the aid of the four micrometers at four different points on the wafer surface corresponding to the locations of the nozzles of the air micrometers. The distances thus measured are then averaged. If the averaged distance lies at the reference plane of the optical projection system, the whole surface of the semiconductor wafer is duly considered to lie in the range of the focal depth of the optical system in which the printing of the projected pattern can be effected with a high resolving power.

Although the average value of the measured distances is made use of for determining whether the wafer lies within the focal depth of the optical system, other values may be adopted for determining the most effective focal plane in consideration of the locations of the air micrometers and the warping in the wafer surface.

The focal plane F-F′ of the optical system is set below the reference plane X-X′ in parallel thereto with a distance of 80 μm for example. Accordingly, the wafer is lowered by rotating the pulse motor until the average value of the measured distances has been equal to 80 μm as measured by means of the air micrometers. In this manner, the focal plane of the optical system can be set at an average height of the wafer in consideration of the convexity and concavity thereof, whereby the whole surface of the wafer can be positioned in the range encompassed by the focal depth of the optical system.

Figure 16:
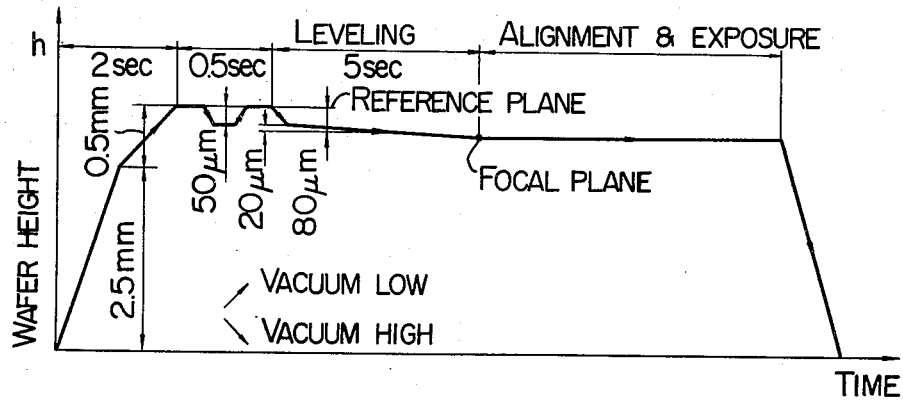
FIG. 16 is a time chart to illustrate a process for setting the position of a wafer according to the invention.

FIG. 16 illustrates the leveling or paralleling operations of the wafer position indexing apparatus described above on the assumption that the leveling process is repeated twice. Time is taken along the abscissa, while the height (h) of the wafer is taken along the ordinate.

It has been experimentally found that the resolving power is improved at a peripheral region of the wafer, whereby printing yield can be increased by approximately 5%, while the leveling operation for the wafer can be automated. Further, the whole surface of a semiconductor wafer which is now available and having a tolerance in flatness in the range of ±10 μm can be covered by the range of the focal depth (±10 μm) of a commonly used optical system. Thus, an improved resolving power can be attained, allowing a fine pattern to be effectively printed and enhancing significantly the yield of LSI chips.

In the foregoing, preferred embodiments of the invention have been described. However, it will be readily appreciated that the invention should not be limited to these illustrated embodiments but encompasses many variations and modifications such as those enumerated below:

(1) The air micrometer serving to detect the parallelism of the wafer can be replaced by other noncontact type measuring means such as electrostatic-capacitive sensors. Further, an electrical micrometer adapted to contact the leveling pads under a very small level of contacting pressure may be used as well.

(2) In the case of the illustrated embodiments, the measurement of the wafer in respect of the concavity, convexity, warping and inclination is effected in the no-load state of the wafer which is held with a space of about 50 μm from the leveling pads. However, such measurements can be carried out with the wafer surface being contacted to the leveling pads. Of couse, the measurement in the no-load state can assure higher accuracy in the measured results.

(3) In the illustrated embodiments, four air micrometers are employed to measure the various parameters described above. Instead, it is possible to use a single air micrometer located at a center of the wafer in constant contact with the wafer surface for the measurement of the convexity, concavity, inclination or the like parameter. More specifically, in the state of the wafer pressed against the leveling pads, the reading in the single measuring means such as the air micrometer should usually be zero. Accordingly, when the reading is −10 μm, for example, it is determined that the wafer is inclined appreciably and the leveling operation is repeated. On the other hand, when the reading is +10 μm, whereby the setting of the wafer at the focal plane is allowed. Although the method described just above is very practical for the wafer having little convexity or concavity, it is not practically suited for the wafer exhibiting appreciable surface irregularity on the order of ±10 μm.

(4) The leveling pads may be provided movably. In this case, the leveling of the wafer is corrected by protruding or withdrawing the leveling pads under monitoring by means of the air micrometer or the like means. The leveling pads may be driven by the pulse motor.

What we claim is:

1. A projection aligner comprising an optical system for projecting a radiation pattern onto a surface of a semiconductor wafer and wafer positioning means for positioning and holding said wafer at a focal plane of said optical system, said wafer positioning means comprising:

leveling means for effecting leveling of said wafer by moving upwardly or downwardly a wafer chuck supporting said wafer thereon, reference level means including a plurality of leveling pads defining a reference plane and adapted to press said wafer rested on said wafer chuck against said reference plane to thereby establish parallelism of said wafer to said reference plane, measuring means provided at least at a position on said reference plane in opposite and spaced relation with the surface of said wafer for measuring the distance of said wafer surface from said reference plane, and drive control means for controlling operation of said leveling means in response to an output signal from said measuring means to thereby stop movement of said wafer chuck when a measured value represented by said output signal has attained a predetermined value corresponding to said focal plane of said optical system.

2. A projection aligner according to claim 1, wherein said measuring means is located at a position on the reference plane corresponding to a center portion of said wafer supported on the wafer chuck.

3. A projection aligner according to claim 1, wherein said drive and control means includes means to determine on the basis of convexity and concavity of said wafer surface determined from said output signal from said measuring means an imaginary plane at which a maximum portion of said wafer surface lies within a focal depth of said optical system, and means to drive said wafer leveling means until said imaginary plane is in coincidence with said focal plane of said optical system.

4. A projection aligner according to claim 1, wherein said reference leveling means includes means for paralleling said wafer by contacting said wafer to said leveling pads and wherein said wafer leveling means includes means, upon completion of said paralleling operation, to move said wafer from said reference plane defined by said leveling pads downwardly to said focal plane of said optical system.

5. A projection aligner according to claim 1, wherein said measuring means includes air micrometer means having a plurality of air nozzles, said air nozzles being disposed on said reference plane at positions in the vicinity of a peripheral portion of said wafer and at a position corresponding to a center portion of said wafer, respectively.

6. A wafer position setting apparatus for setting and maintaining a surface of a semiconductor wafer at a focal plane of an optical system for projecting a radiation pattern onto said surface in a projection aligner, comprising:

(a) reference level head means including a plurality of leveling pads defining a reference plane, (b) air-micrometer means for measuring the distance between said wafer surface and said reference plane in a contactless manner and including a plurality of nozzles disposed on said reference plane at least in the vicinity of respective ones of said leveling pads and opened in opposition to said wafer surface with a distance therefrom, (c) wafer leveling means including a semispherical seat member received rollingly in a socket, and adapted to fixedly support a wafer chuck carrying said wafer thereon and to be moved in parallel to said reference plane, and (d) drive and control means for permitting said movement of said wafer leveling means when a signal representative of parallelism of said wafer as measured by said air-micrometer means is at a value in a predetermined standard range and for producing a signal for setting a plane at which said wafer is to be positioned on the basis of the signal representing parallelism of said wafer surface to thereby displace said wafer leveling means to a required position for setting said wafer at said plane.

7. A wafer position setting apparatus according to claim 6, wherein said drive and control means includes a pulse motor and a sequence controller, and means to repeat the upward and downward movements of said wafer leveling means to bring said wafer on said wafer chuck in contact with said leveling pads repeatedly, to thereby cause said air-micrometer means to measure the parallelism of said wafer repeatedly, whereby setting of said plane is effected by said drive and control means when it is determined that the measured parallelism lies within a predetermined standard range.

8. A wafer position setting apparatus according to claim 6, wherein said plurality of nozzles of said air-micrometer are disposed on said reference plane in the vicinity of a peripheral portion of said wafer and at a center portion of said wafer, said nozzles disposed in the vicinity of the peripheral portion of said wafer being positioned in the vicinity of respective ones of said leveling pads to detect the leveled state and additionally detect the parallelism of said wafer in cooperation with said nozzle located in the vicinity of the center portion of said wafer.

9. A wafer position setting apparatus according to claim 8, wherein said drive and control means comprises means for determining completion of the paralleling operation relative to the focal plane on the basis of output signals derived from said nozzles disposed in the vicinity of the peripheral portion of said wafer, means for detecting convexity and concavity of the wafer surface as well as deformation thereof on the basis of output signals derived from all of said nozzles, and means for determining an imaginary plane at which a maximum portion of said wafer surface is covered by the optical depth of said optical system on the basis of the results of said detections and producing a signal representing displacement of said wafer required to make said imaginary plane to coincide with said focal plane of said optical system.

10. A wafer position setting apparatus according to claim 6, wherein said wafer leveling means is disposed to be movable from the position of said air-micrometer means toward said optical projecting system after completion of the leveling of said wafer held on said wafer chuck and the setting of said plane.

11. An apparatus according to claim 9, wherein a zero adjusting plate member is disposed on the wafer leveling means in place of said wafer prior to the wafer positioning to set said air micrometer means at the reference plane, said plate member having dimensions similar to said wafer and a given flatness.

12. A method of positioning a wafer in a projection aligner including an optical system for projecting a radiation pattern onto a semiconductor wafer, comprising: for setting the wafer surface at a focal plane of said optical system, measuring concavity and convexity of said wafer surface after said wafer surface has been paralleled to said focal plane of said optical system; determining an imaginary plane on the basis of the results of said measurement at which a maximum portion of said wafer surface lies within the focal depth of said optical system; and displacing said wafer so that said imaginary plane coincides with said focal plane of said optical system.

13. A projection aligner comprising an optical system for projecting a radiation pattern onto a surface of a semiconductor wafer and a wafer positioning device for positioning and holding said wafer at a focal plane of said optical system, said wafer positioning device comprising:
(a) wafer leveling means for holding said wafer and effecting leveling of a top surface thereof by vertical movement relative to a reference plane in parallel relation with said focal plane,
(b) non-contacting distance measuring means provided in opposite and spaced relation with the top surface of said wafer for measuring the distance of said wafer surface from said reference plane to determine an optimum positioning plane in the wafer surface at which plane the surface area of the wafer lying in the range corresponding to a focal depth of the optical system is maximum and producing an electric signal representing the optimum plane, and
(c) drive and control means responsive to said electric signal for moving said leveling means to shift said wafer in parallel to said reference plane until said optimum positioning plane coincides with a plane corresponding to said focal plane.

14. A projection aligner according to claim 13, further comprising a plurality of leveling pads defining said reference plane and responsive to said vertical movement of the wafer leveling means to slowly press said wafer surface against said reference plane to thereby establish parallelism of said wafer to the reference plane as the vertical movement is repeated.

15. A projection aligner according to claim 14, wherein said wafer leveling means is adapted to parallel said wafer relative to said reference plane by repeated contacting to said leveling pads and move upon completion of the paralleling operation, said wafer from said reference plane defined by said leveling pads downwardly to the position corresponding to the focal plane of the optical system.

16. A projection aligner according to claim 13, wherein said non-contact measuring means comprises air micrometer means having at least four air nozzles, said air nozzles being disposed on said reference plane at positions in the vicinity of a peripheral portion of said wafer and at a position corresponding to a center portion of said wafer, respectively, to determine non-linear variation of the wafer surface.

17. A projection aligner comprising an optical system for projecting a radiation pattern on a surface of a wafer and wafer positioning means for positioning and holding said wafer at a focal plane of said optical system, said wafer positioning means being located apart from the optical system such that the wafer is movable on the same plane between the wafer positioning means and the optical system, said wafer positioning means comprising:
(a) leveling means for effecting leveling of said wafer by moving a wafer chuck carrying said wafer thereon vertically to a reference plane parallel to said focal plane,
(b) paralleling means having a plurality of leveling pads disposed above said leveling means and defining said reference plane, and responsive to slow contacting of the wafer to said leveling pads caused by said vertical movement to establish parallelism of said wafer to said reference plane, (c) a non-contact distance sensor means provided above a central portion of the wafer in opposite and spaced relation with the top surface of said wafer and operative upon completion of said parallelism of the wafer for measuring the distance of said wafer surface from said reference plane and producing an electrical signal representing a measured distance, and (d) drive and control means responsive to said electrical signal for moving said leveling means downwardly relative to the reference plane to position the central portion of said wafer in a plane corresponding to said focal plane.

18. The projection aligner according to claim 14, 15, 16 or 17, wherein said drive and control means comprises a pressure sensor means provided in said leveling means and responsive to the pressure of the wafer carried on the leveling means to said leveling pads for detecting parallelism of said wafer to the reference plane.

19. The projection aligner according to claim 18, wherein said drive and control means comprises logic circuit means which permits repeated leveling operation of said leveling means when said distance measuring means detects parallelism of said wafer out of a predetermined range during the positioning movement of the leveling means.

20. The projection aligner according to claim 13 or 17, wherein said wafer leveling means uniaxially supports said wafer thereon and is shifted in the optical system in a proper positioning relation when the wafer positioning by said positioning device is accomplished.

21. A wafer position setting apparatus for setting and maintaining a top surface of a semiconductor wafer at a focal plane of an optical system for projecting a radiation pattern onto said surface in a projection aligner, comprising:

(a) reference level head means including a plurality of leveling pads defining a reference plane parallel to said focal plane, (b) air-micrometer means for measuring the distance between said wafer surface and said reference plane in a contactless manner and including a plurality of nozzles disposed on said reference plane at least in the vicinity of respective ones of said leveling pads and opened in opposition to said wafer surface with a distance therefrom, (c) wafer leveling means including a bowl seat member received rollingly in a socket, and adapted to fixedly support a wafer chuck carrying said wafer thereon and to be moved in parallel to and perpendicularly to said reference plane, and (d) drive and control means responsive to the distances measured for permitting said movement of said wafer leveling means when a signal representative of parallelism of said wafer is measured is at a value in a predetermined standard range, and producing a signal for setting a plane at which said wafer is to be positioned on the basis of the signal representing parallelism of said wafer surface to thereby displace said wafer leveling means to a required position for setting said wafer at said plane.

22. A wafer position setting apparatus according to claim 21, wherein said drive and control means includes a pulse motor and a sequence controller, and is adapted to repeat the upward and downward movements of said wafer leveling means, bring said wafer on said wafer chuck in contact with said leveling pads repeatedly, to thereby cause said air-micrometer means to measure the parallelism of said wafer repeatedly, whereby setting of said plane is effected by said drive and control means when it is determined that the measured parallelism lies within a predetermined standard range.

23. A wafer position setting apparatus according to claim 21, wherein said plurality of nozzles of said air-micrometer are disposed on said reference plane in the vicinity of a peripheral portion of said wafer and at a center portion of said wafer, said nozzles disposed in the vicinity of the peripheral portion of said wafer being positioned in the vicinity of respective ones of said leveling pads to detect the leveled state and additionally detect the parallelism of said wafer in cooperation with said nozzle located in the vicinity of the center portion of said wafer.

24. A wafer position setting apparatus according to claim 23, wherein said drive and control means comprises means for determining completion of the paralleling operation relative to the focal plane on the basis of output signals derived from said nozzles disposed in the vicinity of the peripheral portion of said wafer, means for detecting convexity and concavity of the wafer surface as well as deformation thereof on the basis of output signals derived from all of said nozzles, and means for determining an imaginary plane at which a maximum portion of said wafer surface is covered by the optical depth of said optical system on the basis of the results of said detections and producing a signal representing displacement of said wafer required to make said imaginary plane to coincide with said focal plane of said optical system.

25. A wafer position setting apparatus according to claim 21, wherein said wafer leveling means is disposed to be movable from the position of said air-micrometer means toward said optical projecting system after completion of the leveling of said wafer held on said wafer chuck and the setting of said plane.

26. An apparatus according to claim 24, wherein a zero adjusting plate member is disposed on the wafer leveling means in place of said wafer prior to the wafer positioning to set said air-micrometer means at the reference plane, said plate member having dimensions similar to said wafer and a given flatness.

27. A method of positioning a wafer in a projection aligner including an optical system for projecting a radiation pattern onto a semiconductor wafer, comprising: for setting the wafer surface at a focal plane of said optical system, measuring concavity and convexity of said wafer surface; determining an imaginary plane on the basis of the results of said measurement at which the area of said wafer surface lying within the focal depth of said optical system will take a maximum when the imaginary plane is positioned in said focal plane; and displacing said wafer so that said imaginary plane coincides with said focal plane of said optical system.

28. The method of claim 27, wherein prior to said measuring step a wafer leveling step is included for causing the wafer parallel to said reference plane having parallel relation with said focal plane, and said wafer displacing step displaces said wafer in perpendicular and parallel relation with said reference plane.

29. The method of claim 27, wherein said leveling step is repeated until completion of a given range of parallelism relative to the focal plane.

* * * * *